US007439656B2

(12) United States Patent
Ossmann

(10) Patent No.: US 7,439,656 B2
(45) Date of Patent: Oct. 21, 2008

(54) METHOD FOR DESIGNING ULTRASONIC TRANSDUCERS WITH ACOUSTICALLY ACTIVE INTEGRATED ELECTRONICS

(75) Inventor: William Ossmann, Acton, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 367 days.

(21) Appl. No.: 10/559,214

(22) PCT Filed: Jun. 7, 2004

(86) PCT No.: PCT/IB2004/050851

§ 371 (c)(1),
(2), (4) Date: Dec. 6, 2005

(87) PCT Pub. No.: WO2004/109656

PCT Pub. Date: Dec. 16, 2004

(65) Prior Publication Data

US 2006/0150380 A1 Jul. 13, 2006

Related U.S. Application Data

(60) Provisional application No. 60/476,980, filed on Jun. 9, 2003.

(51) Int. Cl.
*H01L 41/08* (2006.01)

(52) U.S. Cl. ...................................... 310/334; 310/327

(58) Field of Classification Search ................. 310/322, 310/326, 327, 334
See application file for complete search history.

(56) References Cited

U.S. PATENT DOCUMENTS

| | | | | |
|---|---|---|---|---|
| 4,211,948 | A * | 7/1980 | Smith et al. | 310/322 |
| 5,435,313 | A | 7/1995 | Noda et al. | |
| 5,592,730 | A | 1/1997 | Greenstein et al. | |
| 5,629,906 | A * | 5/1997 | Sudol et al. | 367/162 |
| 5,744,898 | A | 4/1998 | Smith et al. | |
| 5,886,454 | A * | 3/1999 | Ito et al. | 310/322 |
| 5,977,691 | A | 11/1999 | Stephens et al. | |
| 6,314,057 | B1 | 11/2001 | Solomon et al. | |
| 7,105,986 | B2 * | 9/2006 | Wildes et al. | 310/327 |
| 2003/0011285 | A1 | 1/2003 | Ossmann et al. | |
| 2003/0013967 | A1 | 1/2003 | Savord et al. | |
| 2003/0024317 | A1 | 2/2003 | Miller et al. | |
| 2003/0028108 | A1 | 2/2003 | Miller et al. | |

* cited by examiner

*Primary Examiner*—Thomas M Dougherty

(57) ABSTRACT

Ultrasonic transducer including a multi-layer transformer arranged between a backing block and piezoelectric layer on each of which at least one matching layer is arranged. The transformer includes a substrate having an electronic circuit, one or more acoustically active layers and an interconnect layer interposed between the piezoelectric layer and the substrate. The properties of the substrate, each acoustically active layer and the interconnect layer are selected and then the acoustic impedance of the transformer at a side of the piezoelectric layer adjacent the transformer is determined. The properties are then varied, e.g., using a computer simulation, until values for these properties are obtained which provide a desired acoustic performance characteristic at the side of the piezoelectric layer adjacent the transformer. The electronic circuit is thus considered in the determination of the acoustic impedance of the transformer.

10 Claims, 9 Drawing Sheets

METHOD FOR DESIGNING ULTRASONIC TRANSDUCERS WITH ACOUSTICALLY ACTIVE INTEGRATED ELECTRONICS

CROSS REFERENCE TO RELATED APPLICATION

This application claims the benefit of U.S. provisional application Ser. No. 60/476,980 filed Jun. 9, 2003, which is incorporated herein by reference.

FIELD OF THE INVENTION

The invention relates to a method for designing an acoustic impedance transformer for use in an ultrasonic transducer, and also relates to an ultrasonic transducer with an acoustically active, integrated electronic circuit.

BACKGROUND OF THE INVENTION

A typical ultrasonic transducer used for diagnostic medical imaging commonly includes a layer of piezoelectric material, such as lead zirconate titanate (PZT), one or more acoustic impedance matching layers bonded to one side of the PZT layer and a block of backing material bonded to the other side. The backing block is a substrate of material having an arbitrary thickness. Instead of providing material as the backing block, it is possible to use an air backing.

The matching layers serve to increase the coupling of ultrasonic energy to and from the body or object to be imaged.

The transducer may be divided into an array of multiple independent small transducers (called transducer elements) to facilitate scanning of the ultrasound beam by electronic means. FIG. 1 shows a part of one transducer element 100 of such a transducer.

The backing block 102 and matching layers 104 usually have acoustic impedances lower than that of the piezoelectric layer 106, so that the piezoelectric layer 106 vibrates in a half-wave resonance mode, setting the center frequency of operation of the transducer at approximately $$f_{hw} = \frac{2v}{d}$$

where $f_{hw}$, is the half-wave resonant frequency, v is the speed of sound in the piezoelectric material, and d is the thickness of the piezoelectric material.

Alternatively, one can design the transducer to have a backing material of higher acoustic impedance than the piezoelectric material. In this case, the transducer will operate at a center frequency approximately equal to the quarter-wave resonant frequency, $f_{qw}$, given by $$f_{qw} = \frac{4v}{d}$$

It is clear that for a given piezoelectric material and thickness, these frequencies differ by a factor of two.

Two-dimensional (2-D) ultrasonic phased array transducers present unusual considerations in the design of the backing block. Generally, 2-D arrays require the connection of thousands of individual acoustic transducer elements to the ultrasound system electronics.

In prior art transducers, it has been recognized that it is advantageous to incorporate electronic circuitry in a handle of the transducer to provide transmit, receive, pre-amplification, and partial beam-forming functions. Connections between the acoustic elements and the electronic circuitry are made via conductors or conductive paths embedded in the acoustic backing block of the transducer (as shown for example in U.S. Pat. No. 5,592,730), or via a thin multi-layer interconnect structure between the acoustic elements and the backing block which includes conductors (as shown for example in U.S. Pat. No. 5,977,691). In either case, the electronic circuits are arranged outside of the acoustically active area of the transducer.

These prior art transducers are difficult to fabricate in view of the need to manufacture the backing block with embedded conductors and because each of the thousands of conductors must be connected to the electronic circuitry. Moreover, the presence of the interconnect structure in the active area of the transducer can result in unwanted acoustic scattering sites producing artifacts in the image. Further, the capacitance between signal traces in the interconnect structure introduces undesirable loading on the electronic circuitry and the transducer elements and provides multiple crosstalk paths between individual elements, both of which reduce the transducer's performance. The method of embedding conductors in the backing block also results in a backing block that is bulky and heavy, making the transducer difficult to use. The bulk of such a transducer also precludes the use of this method for endocavity transducers and other transducers which are used in small spaces.

With reference to FIG. 2, an alternative to a transducer with embedded conductors is a transducer 108 in which the required electronic circuitry is placed on one or more semiconductor chips 110 adjacent or in close proximity to the acoustic structure of the transducer whereby the chip with electronic circuitry typically is in the form of an integrated circuit. As a result, the interconnect structure 112 between the chip 110 and the acoustic elements 104,106 becomes nearly inconsequential electrically. Examples of this arrangement are described in U.S. Pat. Nos. 5,435,313 and 5,744,898 and U.S. provisional patent application Ser. No. 60/432,536 filed Dec. 11, 2002 entitled "Miniaturized Ultrasonic Transducer" to Sudol et al. the disclosures of which are incorporated herein by reference.

In these disclosures, acoustic effects of the electronic circuitry are ignored or an attempt is made to suppress them, as for example, by the use of a "mismatching layer" between the piezoelectric element 106 and the electronic circuit on the chip 110. However, these approaches do not yield satisfactory performance for state of the art ultrasonic imaging systems. For use with these imaging systems, a transducer is required to operate over a large bandwidth and the transmit pulses it generates must be as short as possible. For imaging of fine details for example, it is desirable to have a transmit pulse length of less than about 1.6 periods of the transmit frequency measured at about −10 dB.

In another mode called harmonic imaging, the transducer transmits ultrasound at one frequency and receives echoes at the second harmonic or twice that frequency. This requires a transducer with a one-way bandwidth of at least about 67% of the center frequency, measured at about −3 dB. In general, the minimum achievable pulse length is inversely proportional to the bandwidth. For increased performance, transducers with bandwidth approaching and even exceeding 100% of the center frequency are desired. Achieving this level of performance requires careful design of the entire acoustic structure.

The design of matching layer structures for ultrasonic transducers is well known in the art and will not be discussed in detail herein. For high performance transducers, similar attention must be paid to the backing block and any backing layers. Most often, a homogeneous composition of materials is used for the backing block to provide a uniform acoustic impedance and a high acoustic loss so as to remove the effects of reflections from the boundaries of the backing block or any internal structures that may be necessary for mechanical or thermal considerations.

The presence of an electronic chip and possibly an electrical interconnect layer between the backing block and the piezoelectric layer transforms the acoustic impedance presented to the back side of the piezoelectric layer and this transformation is dependent on the frequency. For a single backing layer, there are two sets of frequencies of particular interest. At frequencies where the backing layer is an integral number of half wavelengths thick, the acoustic impedance seen at the front of the backing layer is equal to the acoustic impedance loading the back side of the backing layer; the transformation ratio is unity (1). At frequencies where the backing layer is an odd number of quarter wavelengths thick, the acoustic impedance seen at the front of the layer is:

$$Z_{qw} = \frac{Z_c^2}{Z_L}$$

where $Z_{qw}$ is the transformed impedance seen at the front of the backing layer, $Z_c$ is the characteristic acoustic impedance of the material of the backing layer (backing layer impedance), and $Z_L$ is the acoustic load impedance at the back side of the backing layer.

If the backing layer impedance is high compared to $Z_L$, then the transformed impedance is much higher than the backing layer impedance itself. Conversely, if the backing layer impedance is low compared to $Z_L$, then the transformed impedance is much lower than the backing layer impedance. In between quarter and half wave frequencies, the transformed impedance takes on values that are complex numbers with a magnitude intermediate between the backing layer impedance and the quarter wave transformed impedance.

Each backing layer further transforms the impedance generated by the backing layers behind it (when multiple backing layers are present). Since the other backing layers generate an impedance that varies with frequency, the behavior can be quite complicated, but can be modeled by the well-known transformation:

$$Z_{in} = Z_c \frac{Z_L + jZ_c \tan\left(\frac{2\pi d}{\lambda}\right)}{Z_c + jZ_L \tan\left(\frac{2\pi d}{\lambda}\right)}$$

where $Z_{in}$, is the transformed impedance, 8 is the wavelength of sound in the layer material, d is the thickness of the backing layer, and j is the square root of −1. Generally, impedances lower than the backing layer impedance are transformed to high impedances and impedances higher than the backing layer impedance are transformed to low impedances.

The backing block impedance as transformed by a single layer can vary greatly with frequency and adding further layers may cause further variation resulting in large resonant peaks and nulls in the final transformed impedance. An electronic circuit, for example a silicon integrated circuit, and an associated interconnect layer will transform the impedance of the backing block behind them as just described so that at some frequencies, the transformed impedance may be very high while at others it may be very low.

As noted above, a transducer with a high backing block impedance will operate in quarter wave mode and at approximately twice the frequency of a transducer with the same piezoelectric layer but with a low impedance backing layer. A transducer with a backing block impedance that is a function of frequency may operate in quarter wave mode at frequencies where the transformed backing block impedance is high and in half wave mode at frequencies where the transformed backing block impedance is low. A transducer designed for one mode will operate poorly in the other mode, so having different modes at different frequencies within the desired operating band will result in a badly shaped, narrow spectrum possibly having resonant peaks or nulls.

Even if a mixture of modes does not occur, a frequency-dependent backing block impedance can introduce unwanted distortions into the transmitted spectrum. Such a spectrum precludes operation at multiple or harmonic frequencies and results in an unacceptably long transmit pulse.

From these considerations, it can be seen that prior art transducers incorporating an electronic circuit in close proximity to the acoustically active layers will fail to yield optimum performance.

OBJECTS AND SUMMARY OF THE INVENTION

It is an object of the invention to provide a new method for designing an acoustic impedance transformer for use in an ultrasonic transducer.

It is an object of the invention to provide a method for incorporating an electronic circuit in the acoustic design of a transducer to provide the transducer with desired acoustic performance, and optionally to optimize the acoustic performance of the transducer, and a transducer with such an incorporated electronic circuit.

It is another object of the invention to provide a new ultrasonic transducer with an acoustically active, integrated electronic circuit.

In order to achieve these objects and others, when designing an ultrasonic transducer in accordance with the invention, instead of considering the effect a single layer of impedance transforming material has on the acoustic performance of the transducer, a multi-layer transformer is designed in which a substrate having the electronic circuit is one of the layers and the combined effect of the components of the multi-layer transformer on the acoustic performance is considered. The properties of the components of the multi-layer transformer, and possibly the number of components, are then varied to arrive at a transformer with the desired acoustic performance. The variations in the properties of the components may be subject to limitations, e.g., manufacturing, cost or structural limitations.

More specifically, the multi-layer transformer is typically placed between a backing block and a piezoelectric layer on which at least one matching layer is arranged and includes a substrate having the electronic circuit arranged in connection therewith, one or more acoustically active layers and an interconnect layer for connecting one of the acoustically active layers on a side of the piezoelectric layer or the piezoelectric layer to the substrate. The properties of the substrate, each acoustically active layer and the interconnect layer are selected and then the acoustic impedance of the transformer at a side of the piezoelectric layer adjacent the transformer is determined. In this manner, the electronic circuit is considered in the determination of the acoustic impedance of the transformer. In the design process, the properties of the substrate, each acoustically active layer and the interconnect layer are varied, e.g., using a computer simulation, until values are obtained which provide a desired acoustic performance characteristics at the side of the piezoelectric layer adjacent the transformer. The properties may provide an optimum acoustic impedance at the side of the piezoelectric layer adjacent the transformer. Also, the properties may be selected to provide particular types of transducers, for example, a transducer operative in the quarter wave mode or a transducer operative in a half wave mode. The variable properties of the substrate, each acoustically active layer and the interconnect layer are their material or composition and thickness. Also, different types of interconnect layers can be tested. Other properties of the components can also be varied to the extent possible. If the transformer is designed to include multiple acoustically active layers, then the number of acoustically active layers can also be varied to obtain the desired acoustic performance characteristics at the side of the piezoelectric layer adjacent the transformer. If the transformer includes an additional interconnect layer for connecting the electronic circuit to a transducer cable, then the type, material and thickness of this additional interconnect layer can also be varied to obtain the desired acoustic performance characteristics at the side of the piezoelectric layer adjacent the transformer.

Generally, one or more of the varied properties of the components of the transformer may be subject to design limitations. Thus, in the design process, limitations in the variations of the material and thickness of the substrate, the material and thickness of the at least one acoustically active layer and the type, material and thickness of the interconnect layer can be imposed.

An ultrasonic transducer in accordance with the invention, which may be designed by the method discussed above, comprises an acoustic backing block, an acoustic impedance transformer arranged on the backing block, a piezoelectric layer arranged on the transformer and at least one matching layer arranged on the piezoelectric layer. The piezoelectric layer and each matching layer may be partitioned to form an array of transducer elements. The transformer includes a substrate, an electronic circuit arranged in connection with the substrate and at least one acoustically active layer different than the backing block. The substrate may be made of a semiconductor material so that the electronic circuit is fabricated thereon.

The transformer will typically include an interconnect layer having an acoustic impedance and arranged between the substrate and an acoustically active layer on the side of the piezoelectric layer or between the substrate and the piezoelectric layer. The substrate may thus be arranged adjacent the backing block and the acoustically active layer is arranged adjacent the piezoelectric layer, when present on the side of the piezoelectric layer. One or more additional acoustically active layers may be arranged on an opposite side of the substrate, i.e., between the substrate and the backing block. One or more of the acoustically active layers adjacent the piezoelectric layer may also be partitioned in accordance with the partitioning of the piezoelectric and matching layers so that each transducer element may include a part of the acoustically active layers in addition to a part of the piezoelectric layer and a part of each matching layer. Partitioning of the acoustically active layers may be performed through their entire thickness or through only a portion of their thickness.

BRIEF DESCRIPTION OF THE DRAWINGS

The invention, together with further objects and advantages hereof, may best be understood by reference to the following description taken in conjunction with the accompanying drawings, wherein like reference numerals identify like elements and wherein.

DETAILED DESCRIPTION OF THE INVENTION

Figure 4:
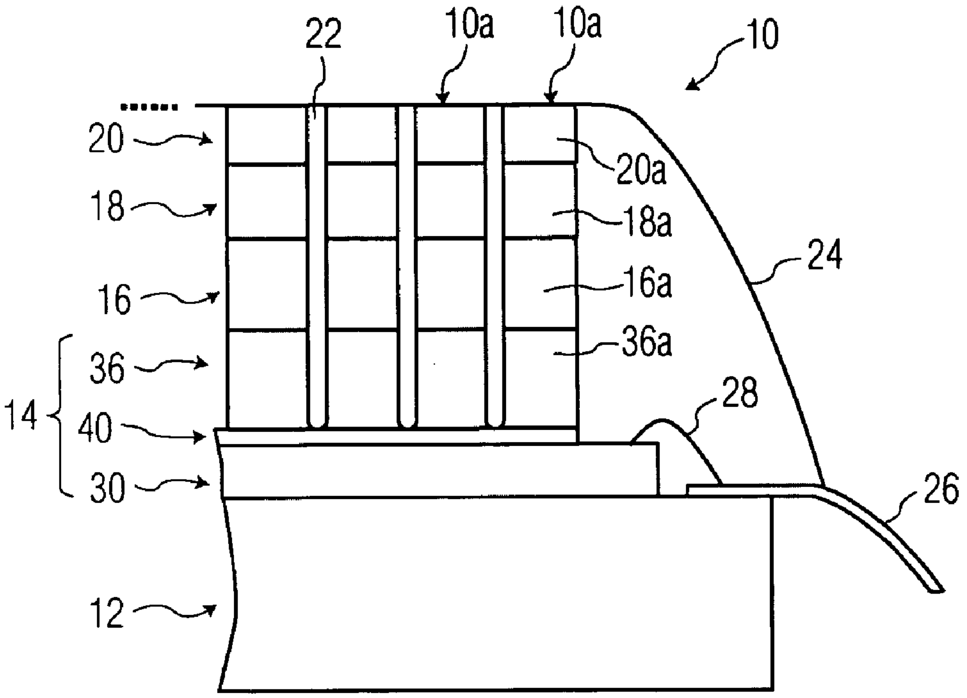
FIG. 4 shows several elements of a first embodiment of a transducer made by a method in accordance with the invention.

Referring to the accompanying drawings wherein like reference numerals refer to the same or similar elements, FIG. 4 shows several transducer elements 10*a* of a transducer 10 for a phased array transducer in accordance with the invention.

The transducer includes a plurality of such transducer elements 10*a* arranged in a one-dimensional or two-dimensional array. In the array, the transducer elements 10*a* may be arranged in a flat plane in one or more dimensions or in a curve in one or more dimensions.

Transducer 10 comprises a backing block 12 and an acoustic impedance transformer 14 arranged on a front side of the backing block 12, a piezoelectric layer 16 arranged on the transformer 14 and two matching layers 18,20 arranged on the piezoelectric layer 16. The piezoelectric layer 16 and the matching layers 18,20 are partitioned into the transducer elements 10*a* so that each transducer element 10*a* includes a section 16*a* of the piezoelectric layer 16 and a section 18*a*,20*a* of each of the matching layers 18,20. Although a single piezoelectric layer 16 and two matching layers 18,20 are shown, any number of piezoelectric layers and matching layers can be provided.

The matching layers 18,20 may be fabricated separate and apart from the fabrication of the remaining parts of the transducer 10. For example, the matching layers 18,20 may be polymer film which is cut into segments the size of each transducer element 10*a* and then attached to the piezoelectric layer 16 by epoxy or another adhesive. An element metallization layer 22 is applied to the upper surface of the uppermost matching layer 20, over all of the transducer elements 10*a* and therebetween, and a conductor 24 is provided for grounding the transducer elements 10*a* via a flexible circuit board 26. Other appropriate ways to ground the transducer elements 10*a* can also be used in the invention. Thus the use of the metallization layer 22 and conductor 24 is but one exemplifying method of providing a ground connection when all the matching layers 18,20 are conductive. An important consideration is to provide electrical connection to an electrode on the top surface of the piezoelectric layer 16. Other methods would include incorporating a metallization layer between matching layers, direct attachment of a metallization layer to the top electrode, or fabricating the top electrode so that it wraps around the edge to the back side of the piezoelectric layer 16.

Electrical conductors 28 are also provided for electrically coupling circuitry on the circuit board 26 to an electronic circuit in the transformer 14.

The transformer 14 includes at a minimum a chip 30 including the electronic circuit and referred hereinafter as the integrated circuit, at least one acoustically active layer and an interconnect layer 40 arranged above the integrated circuit 30 for connecting the integrated circuit to the overlying layer. The layer overlying the interconnect layer 40 may be the piezoelectric layer 16 if no acoustically active layer is provided between the integrated circuit 30 and the piezoelectric layer 16 or may be an acoustically active layer when one or more such layers are provided between the integrated circuit 30 and the piezoelectric layer 16. In embodiments in which there is one or more acoustically active layer between the interconnect layer 40 and the piezoelectric layer 16, these layers must be made of an electrically conductive material or otherwise provide a conductive path from the interconnect layer 40 to the back electrode on the piezoelectric layer 16, for example by having conductive paths embedded within the layer.

FIG. 4 shows an embodiment wherein the transformer 14 includes a single acoustic layer 36 arranged between the interconnect layer 40 and the piezoelectric layer 16. Additional acoustic layers can be provided between the interconnect layer 40 and the piezoelectric layer 16.

The acoustic layer 36 is partitioned into sections 36*a*, possibly in the same manufacturing process as the piezoelectric layer 16 is partitioned, with each section 36*a* being part of a respective transducer element 10*a*. Thus, each transducer element 10*a* includes an acoustic layer section 36*a*, a piezoelectric layer section 16*a* and matching layer sections 18*a*, 20*a*.

Figure 5:
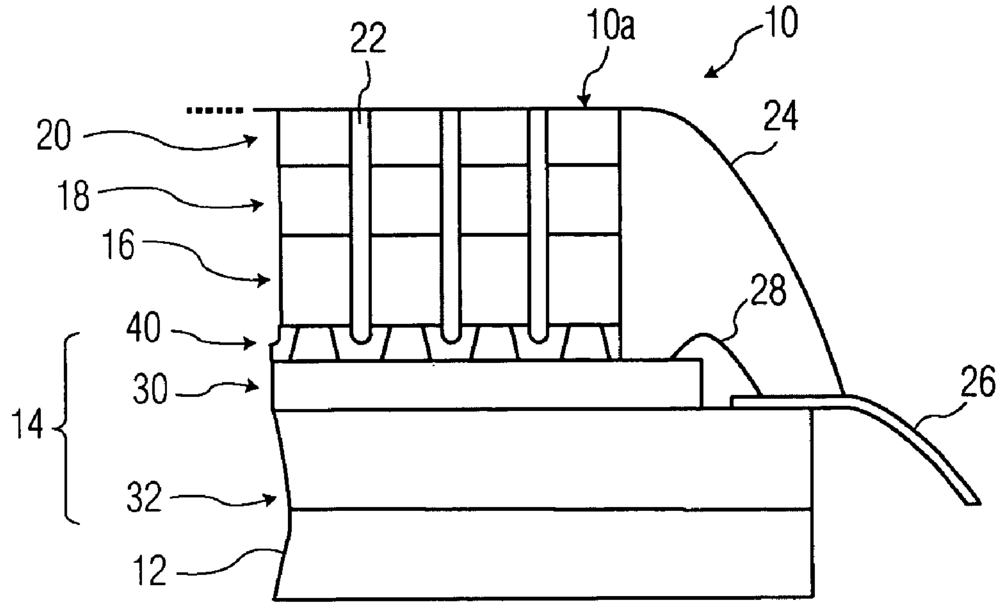
FIG. 5 shows several elements of a second embodiment of a transducer made by a method in accordance with the invention.
Figure 6:
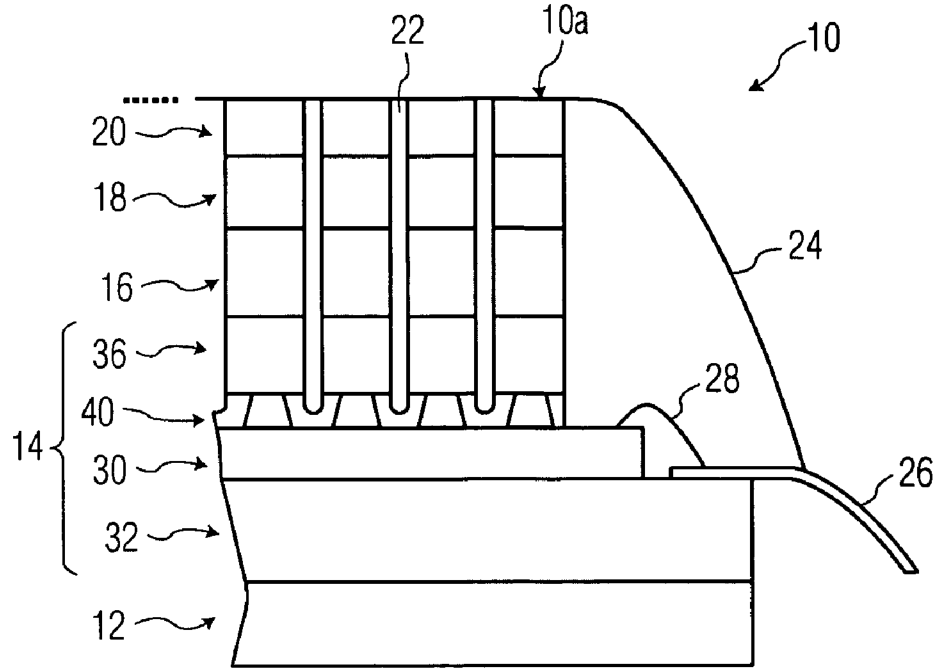
FIG. 6 shows several elements of a third embodiment of a transducer made by a method in accordance with the invention.

FIG. 5 shows a transformer 14 including an integrated circuit 30, a single acoustic layer 32 arranged between the integrated circuit 30 and the backing block 12, and an interconnect layer 40 arranged between the integrated circuit 30 and the piezoelectric layer 16. FIG. 6 shows a transformer 14 including an integrated circuit 30, a single acoustic layer 32 arranged between the integrated circuit 30 and the backing block 12, a single acoustic layer 36 arranged between the integrated circuit 30 and the piezoelectric layer 16 and an interconnect layer 40 arranged between the integrated circuit 30 and the acoustic layer 36.

Figure 7:
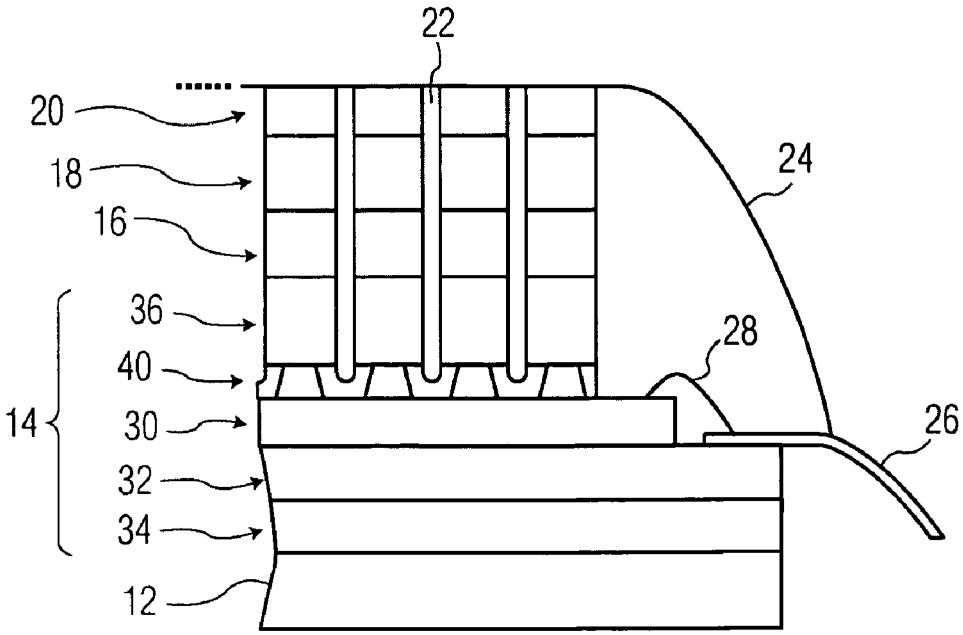
FIG. 7 shows several elements of a fourth embodiment of a transducer made by a method in accordance with the invention.

FIG. 7 shows a transformer 14 including an integrated circuit 30, two acoustic layers 32,34 arranged between the integrated circuit 30 and the backing block 12, a single acoustic layer 36 arranged between the integrated circuit 30 and the piezoelectric layer 16 and an interconnect layer 40 arranged between the integrated circuit 30 and the acoustic layer 36.

Figure 8:
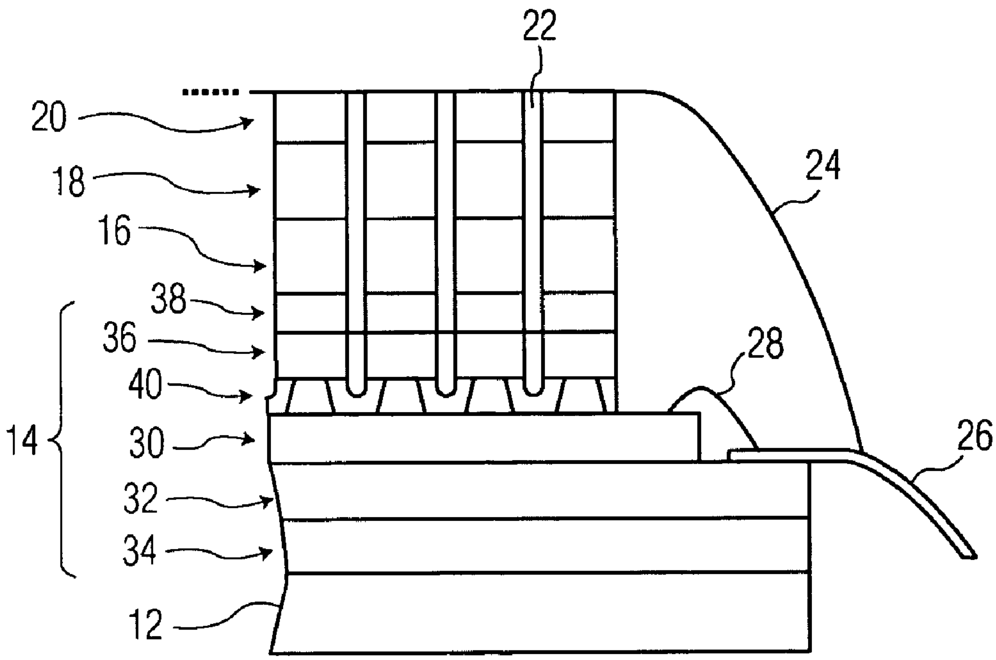
FIG. 8 shows several elements of a fifth embodiment of a transducer made by a method in accordance with the invention.

FIG. 8 shows a transformer similar to the one shown in FIG. 7 but which includes interconnect layer 40, two acoustic layers 36, 38 between the interconnect layer 40 and the piezoelectric layer 16. The number of such acoustic layers between the interconnect layer 40 and the piezoelectric layer 16 can be selected in the design process discussed below.

The electronic circuit in the integrated circuit 30 is incorporated into the acoustic design of the transducer 10 to enable a desired acoustic performance of the transducer to be obtained, for example, to optimize the acoustic performance of the transducer 10. That is, the integrated circuit 30 including the electronic circuit is considered as one of the layers of the transformer 14 when considering impedance properties and assessing acoustic performance. The impedance of the transformer 14 is typically considered at the front side of the transformer 14, i.e., at the rear side of the piezoelectric layer 16.

The electronic circuit in the integrated circuit 30 may be fabricated on a silicon wafer using standard integrated circuit processing techniques. Other semiconductor materials also could be used to enable fabrication of a chip with an electronic circuit, provided they possess the ability to form and enable operation of the electronic circuit.

The transformer 14 can also include one or more layers for interconnecting the electronic circuit in integrated circuit 30 to the piezoelectric layer 16 and to the transducer cable (not shown). Each of these possible additional interconnect layers has acoustic properties, specifically a speed of sound and an acoustic impedance, that may be used and factored in the design of the transformer 14.

The transformer 14 is constructed, with respect to the properties of each of the components such as the acoustic layers 32,34,36,38 by methods analogous to the design of multi-section impedance transformers used in microwave electronics. In such impedance transformers used in microwave electronics, a series of transmission line sections are connected in cascade between a source and a load. Typically, each transmission line section is one quarter of a wavelength long at the center frequency of the band of interest and has a characteristic impedance determined by the impedance transformation desired, the number of sections in the transformer and the bandwidth of interest. Standard designs for microwave quarter wave transformers effecting a wide range of impedance transformation ratios and using up to at least eight sections are known to those skilled in the microwave electronics art.

Analogously, an acoustic impedance transformer in accordance with the invention may be designed and constructed using the same method and design equations as used for designing and constructing impedance transformers used in microwave electronics. In the acoustic impedance transformer, the electronic circuit and any interconnect layers become acoustically active layers which are included in the acoustic design of the transformer and tailored to meet the performance requirements. In most cases, the acoustic load also is an adjustable parameter.

Figure 9:
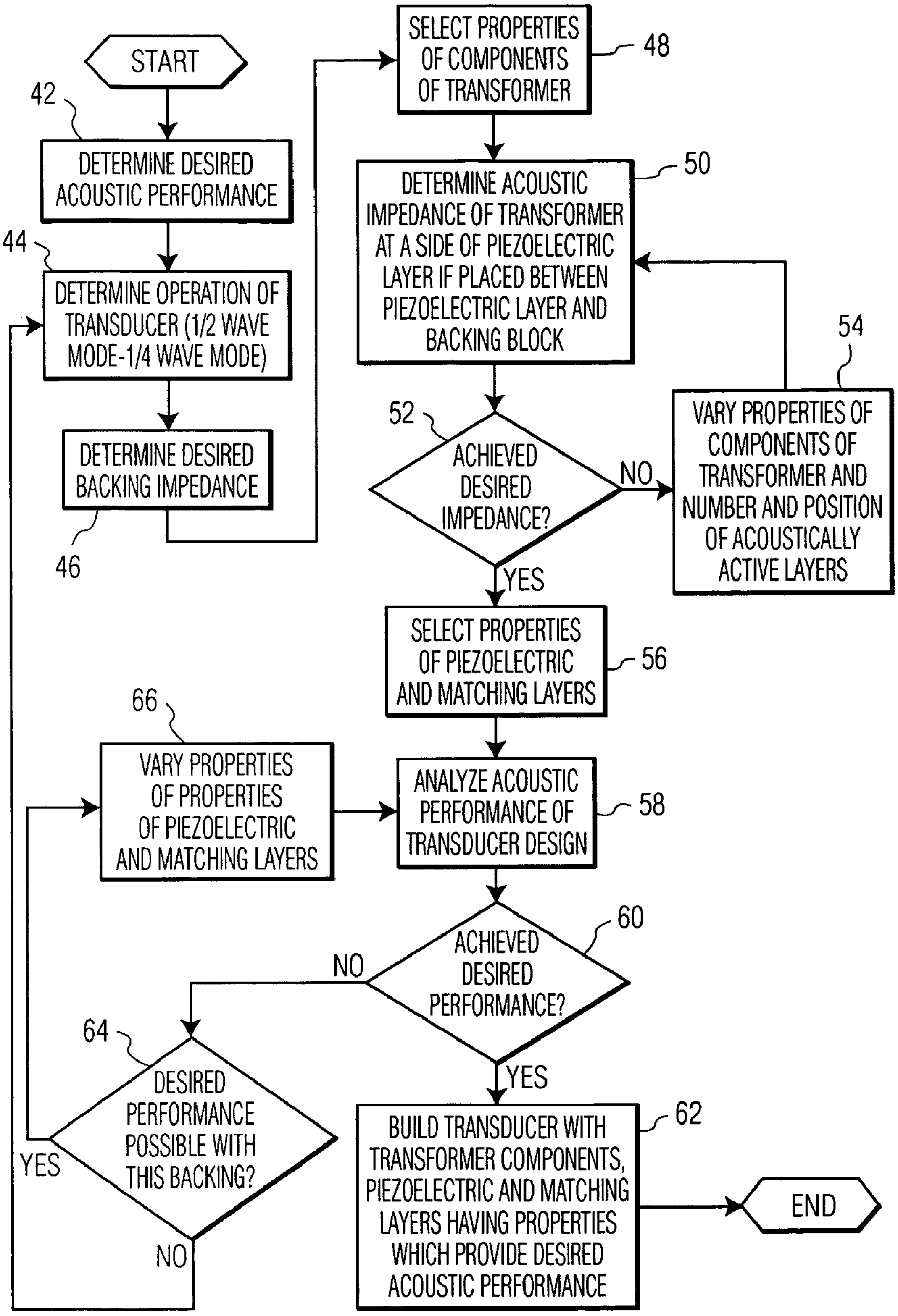
FIG. 9 is a flow chart showing the steps in the method in accordance with the invention.

Referring now to FIG. 9, in the design process, initially, the desired acoustic performance of the transducer will be considered, for example, the center frequency, bandwidth and impulse response characteristics (step 42). Then, a determination is made whether the transducer will operate in quarter wave mode or half wave mode (step 44). This determines whether a high backing impedance or a low backing impedance is desired (step 46). From this and consideration of the desired acoustic performance, the actual desired magnitude of the backing impedance is determined. Then, the components to be present in the transformer 14 are determined and the properties of each component are determined, e.g., the material and thickness of each component as well as the type of interconnect layer (step 48). The acoustic performance of the transformer 14 constructed as such is determined, for example, in the manner described above or in any known manner (step 50).

Thereafter, a test is made whether the desired impedance is achieved (step 52) and if the desired impedance is not achieved, the properties of the components are varied (step 54), for example, the material and/or thickness of the substrate and/or the number and position of the acoustically active layers are varied, and then the acoustic performance of the modified transformer 14 is determined (step 50). Repeated variations of one or more properties of one or more of the components of the transformer 14 and the subsequent determination of the acoustic performance of the transformer variations 14 are made and analyzed to see whether any provide the desired acoustic impedance (step 52). If so, properties of the piezoelectric and matching layers are chosen (step 56), for example acoustic impedance and thickness, and the acoustic performance of the entire transducer is analyzed (step 58) to see if the desired acoustic performance is achieved (step 60). If so, the transducer 10 may then be constructed with the components having the properties which provide the desired acoustic performance (step 62).

Otherwise, a determination is made whether it is possible to achieve the desired acoustic performance with the selected backing impedance (step 64). If so, the properties of the piezoelectric and matching layers are varied (step 66) and the acoustic performance of the modified transducer is analyzed (step 58). Repeated variations of one or more properties of the piezoelectric layer or one or more of the matching layers are made and analyzed to see whether the desired acoustic performance is achieved. If not, it may be possible to achieve the desired performance by choosing a different mode of operation for the transducer or a new backing impedance. Otherwise, it is possible to select the properties of the components to provide the best acoustic performance, even if not the desired acoustic performance. The design process can also be performed to obtain the optimum acoustic performance.

Variations in the properties of the components may be changed singly, e.g., only the thickness of the substrate is varied, or in combination, e.g., both the material and thickness of the substrate is changed.

There are often constraints on the design of the impedance transformer in accordance with the invention in that for example, one or more layers may need to be made of a specific material or have a specified minimum or maximum thickness. These constraints may require deviations from the ideal design of the transformer, such as modifying the thickness or impedance of one or more of the other layers. Optimization of the design most likely would be carried out with the aid of a computer using a simulation program.

In some embodiments such as shown in FIGS. 6, 7 and 8, acoustic layers may be arranged both above and below the integrated circuit 30 including the electronic circuit, i.e., acoustic layers 32 and 34 are arranged below the integrated circuit 30 and acoustic layer 36 is arranged above the integrated 30. It is to be understood that the number, composition and/or thickness of all the layers in any particular embodiment will be determined by the design process and will depend, at least in part, on the desired operating parameters of the transducer.

Generally, when designing and constructing the transducer, at least the thickness of the chip including the electronic circuit will be specified. In the case of an integrated circuit fabricated on a silicon wafer, this thickness can be produced using any wafer thinning process that is commonly used in the integrated circuit industry.

The interconnect layer represents any known means for enabling the connection of material layers to integrated circuits that is appropriate to the application, for example, conductive epoxy or "flip chip" bonding. The type of interconnect layer may be varied in the design phase to obtain the desired acoustic performance of the transformer 14.

The particular connection means selected should provide a layer with consistent acoustical properties and thickness. The acoustic properties desired for the interconnect layer in the final form of the acoustic transformer may determine the choice of the interconnect means. In addition, there are limits on the materials available and the possible thickness with which they may be fabricated that will influence the acoustic design.

Figure 1:
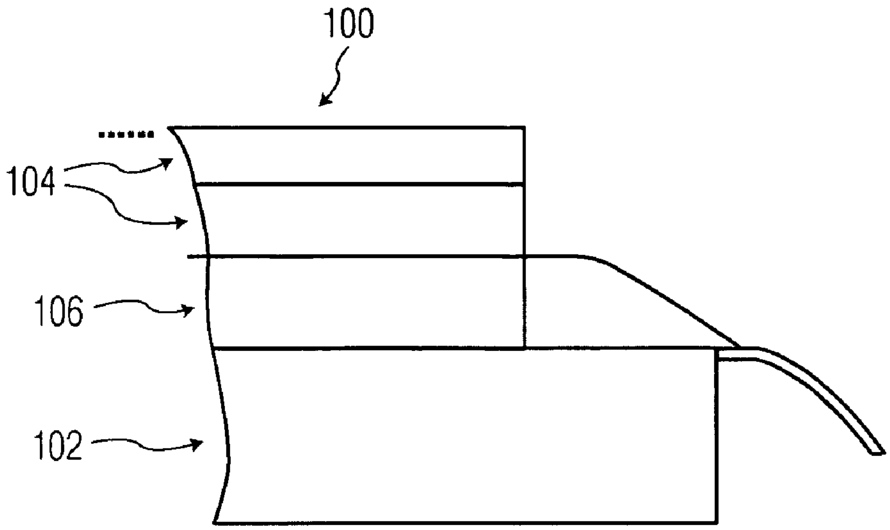
FIG. 1 shows part of a prior art transducer element.
Figure 2:
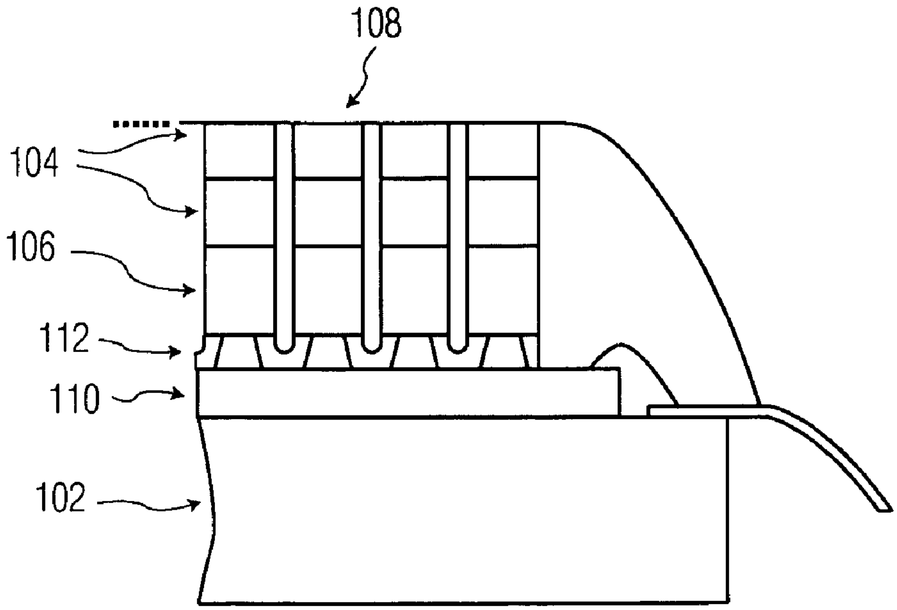
FIG. 2 shows several elements of another prior art transducer.
Figure 3A:
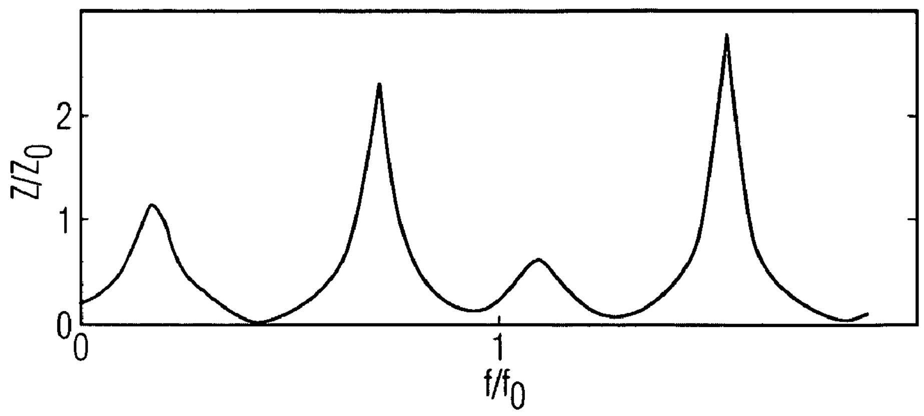
FIG. 3A is a graph of a possible acoustic impedance of the backing block of the prior art transducer shown in FIG. 2.

The advantage of the design of the transformer 14 in a transducer in accordance with the invention will now be discussed with reference to FIGS. 3A-3C and FIGS. 10-12C. FIG. 3A is a chart of the possible acoustic impedance (backing impedance) of the backing structure of the prior art transducer shown in FIG. 2 wherein the horizontal scale is the frequency normalized to the center frequency of the transducer 108 ($f/f_c$) and the vertical scale is the magnitude of the resulting acoustic impedance divided by a typical impedance for a piezoelectric material ($Z/Z_o$). The backing structure includes the backing block 102, the integrated circuit 110 and the interconnect layer 112. The integrated circuit 110 and the interconnect layer 112 are placed on backing block 102 without regard to their acoustic properties. Without considering or optimizing the acoustic properties of the integrated circuit 110 and interconnect layer 112, the acoustic impedance seen by the back side of the piezoelectric layer 106 would have significant peaks and nulls as shown in FIG. 3A.

Although the graph shown in FIG. 3A is exemplary and the actual graph would depend on the details of the transducer construction, the large peaks and nulls in the impedance are typical and would cause a seriously degraded spectrum for the transducer.

Figure 3B:
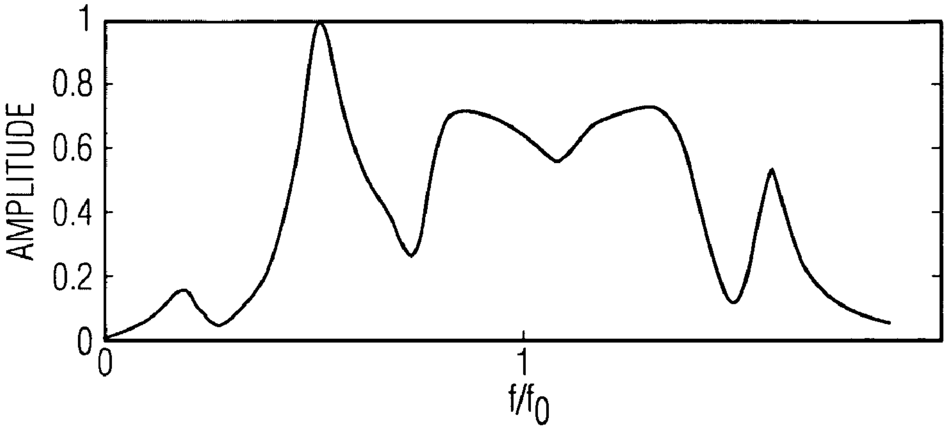
FIG. 3B is a graph of the frequency response of the prior art transducer shown in FIG. 2 having the acoustic impedance shown in FIG. 3A.
Figure 3C:
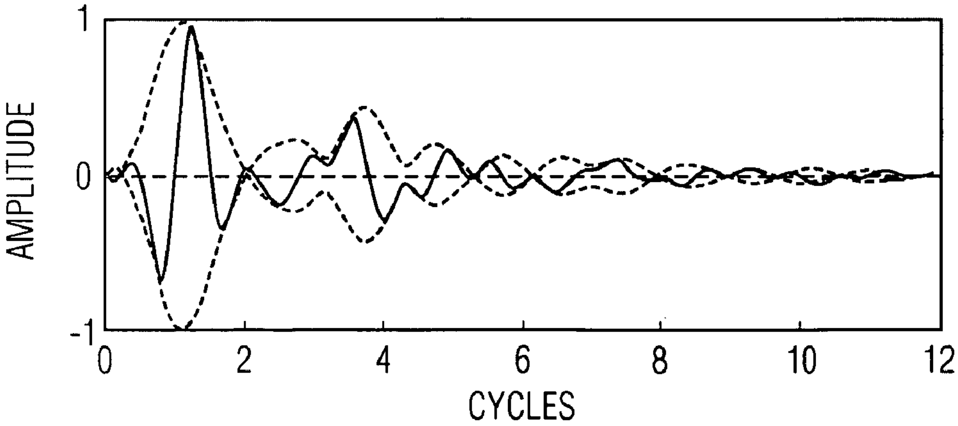
FIG. 3C is a graph of the transmit pulse of the prior art transducer shown in FIG. 2 having the frequency response shown in FIG. 3B.

FIG. 3B shows a possible frequency response resulting from an attempt to construct a broad band transducer on the backing structure described above. There are noticeable, deep nulls in the spectrum corresponding to the large peaks in the impedance shown in FIG. 3A. The resulting transmit pulse is shown in FIG. 3C in which the horizontal scale is time measured in cycles of the center frequency and the vertical scale is the amplitude of the pulse. Both the waveform and its envelope are shown in FIG. 3C. The continuation of the waveform for several cycles beyond the main pulse renders a transducer constructed on the backing structure unusable for modern ultrasound imaging systems. In particular, the pulse width as measured at the most widely separated −10 dB of the envelope is well over 3 cycles.

Figure 10A:
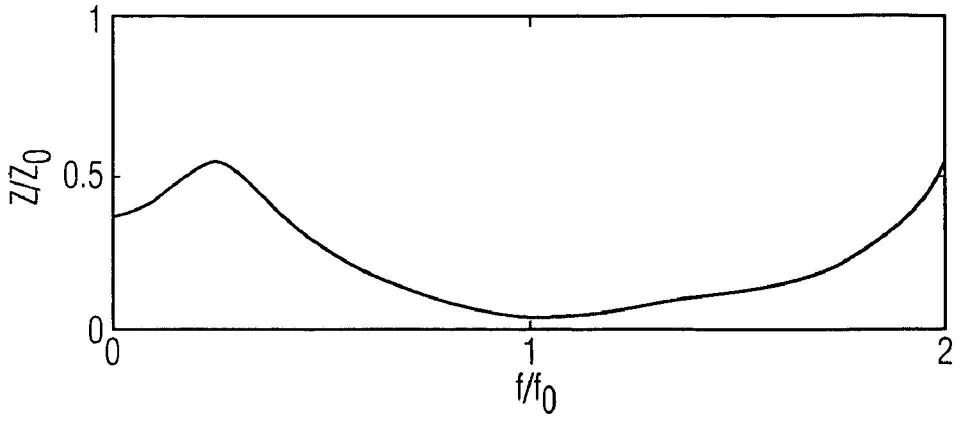
FIG. 10A is a graph of a possible acoustic impedance of the transformer of the transducer shown in FIG. 5.

Using a transformer 14 in a transducer 10 in accordance with the invention having a single acoustically active layer 32 between the integrated circuit 30 and the backing block 12 as shown in FIG. 5, the acoustic impedance seen by the back side of the piezoelectric layer 16 is substantially more uniform as shown in FIG. 10A in comparison to the acoustic impedance shown in FIG. 3A. It is important though that the thickness of the integrated circuit 30 and/or the thickness of the interconnect layer 40 are adjusted through the design process described above and then particular thicknesses selected to provide a suitable backing impedance.

Figure 10B:
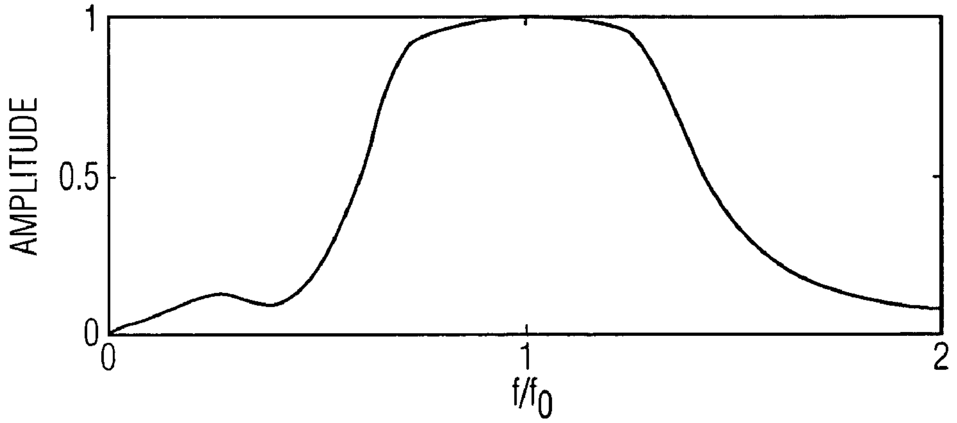
FIG. 10B is a graph of the frequency response of the transducer in accordance with the invention having the acoustic impedance shown in FIG. 10A.
Figure 10C:
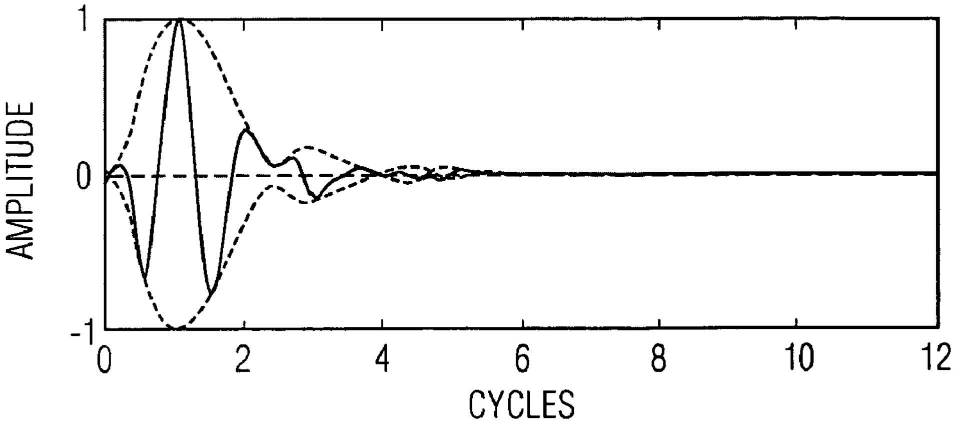
FIG. 10C is a graph of the transmit pulse of the transducer in accordance with the invention having the frequency response shown in FIG. 10B.

FIG. 10B shows the frequency response resulting from a transducer in accordance with the invention having the acoustic impedance shown in FIG. 10A and the resulting transmit pulse is shown in FIG. 10C. Both the waveform and its envelope are shown in FIG. 10C. The frequency response has a bandwidth at −3 dB which is slightly more than about 70% of the center frequency, and the width of the transmit impulse response at −10 dB is approximately 1.6 cycles.

Figure 11A:
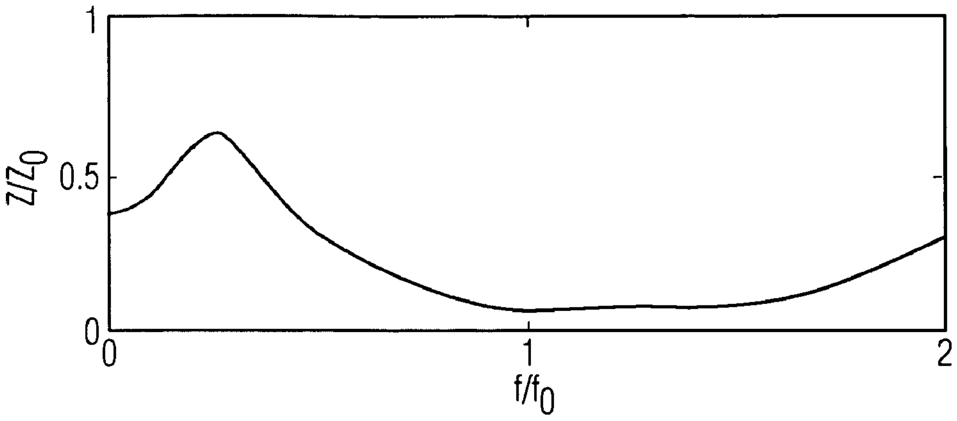
FIG. 11A is a graph of a possible acoustic impedance of the transformer of the transducer shown in FIG. 6.
Figure 11B:
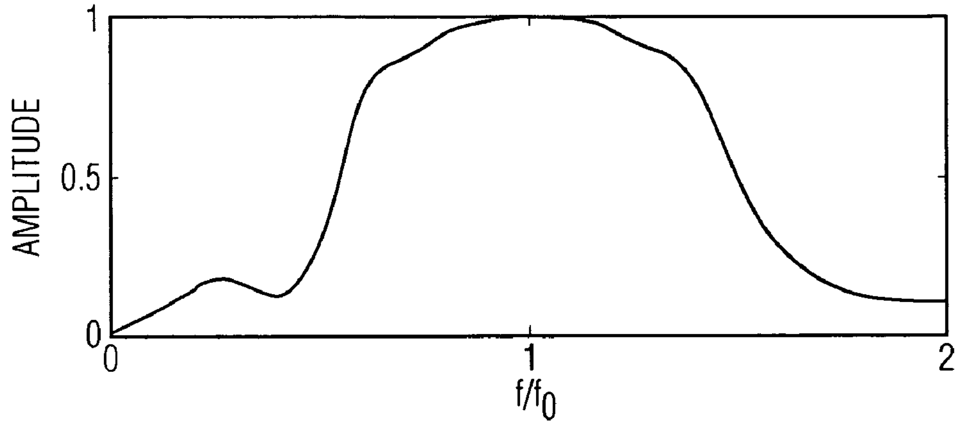
FIG. 11B is a graph of the frequency response of the transducer in accordance with the invention having the acoustic impedance shown in FIG. 11A.
Figure 11C:
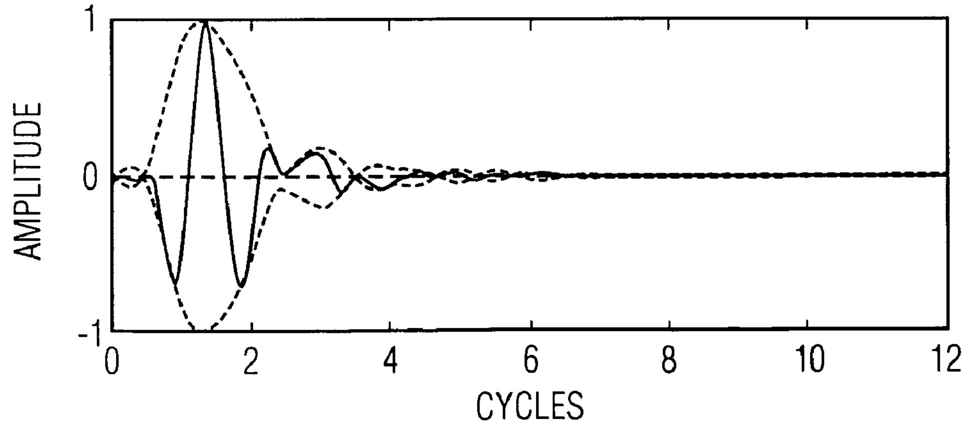
FIG. 11C is a graph of the transmit pulse of the transducer in accordance with the invention having the frequency response shown in FIG. 11B.

Referring now to FIGS. 11A-11C, for the transformer 14 shown in FIG. 6, the acoustic impedance seen by the back side of the piezoelectric layer 16 is substantially more uniform as shown in FIG. 11A in comparison to the acoustic impedance shown in FIG. 3A. The thickness of the integrated circuit 30 and the thickness of the interconnect layer 40 are adjusted through the design process described above and then particular thicknesses are selected to provide a suitable backing impedance.

FIG. 11B shows the frequency response resulting from a transducer in accordance with the invention having the acoustic impedance shown in FIG. 11A and the resulting transmit pulse is shown in FIG. 11C. The frequency response has a bandwidth at −3 dB which is slightly more than about 80% of the center frequency, and the width of the transmit impulse response at −10 dB is approximately 1.4 cycles.

Figure 12A:
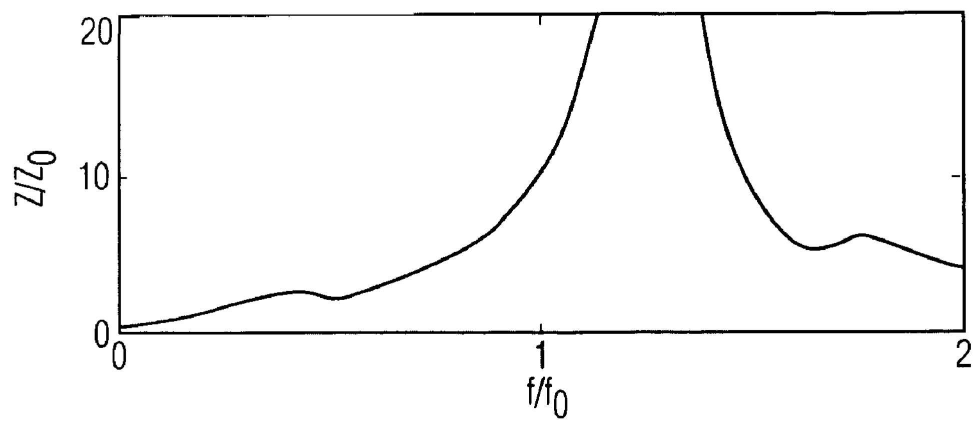
FIG. 12A is a graph of a possible acoustic impedance of a transformer of a transducer in accordance with the invention operative in quarter wave mode.
Figure 12B:
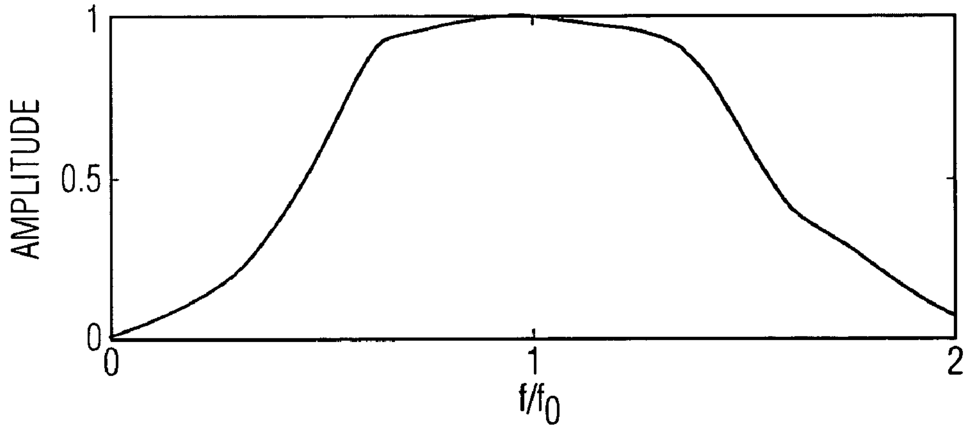
FIG. 12B is a graph of the frequency response of the transducer in accordance with the invention having the acoustic impedance shown in FIG. 12A.
Figure 12C:
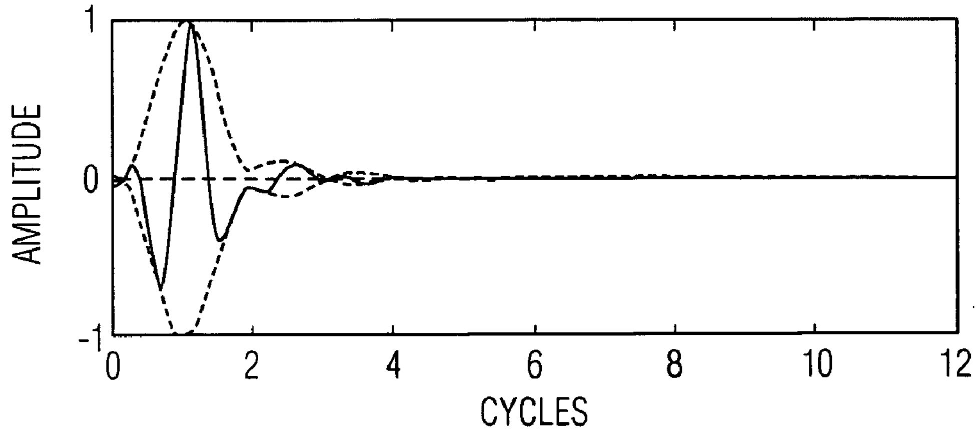
FIG. 12C is a graph of the transmit pulse of the transducer in accordance with the invention having the frequency response shown in FIG. 12B.

Referring now to FIGS. 12A-12C, for the transformer 14 shown in FIG. 6 when designed to operate in quarter wave mode, the transformer is designed to provide as large an acoustic impedance as possible at the back side of the piezoelectric layer which is achieved by appropriate selection of the number of layers in the transformer and the properties of these layers. By contrast, the graphs in FIGS. 10A-11C for the transducers with the transformers shown in FIGS. 5 and 6 operate in half wave mode.

A representative plot of the backing acoustic impedance for this embodiment is shown in FIG. 12A. The vertical scale is significantly increased from the scale in FIGS. 9A and 10A, and the impedance magnitude exceeds even this scale for part of the band of interest. A possible resulting frequency response and transmit pulse are shown in FIGS. 12B and 12C, respectively. The frequency response has a bandwidth at −3 dB which is over 90% of the center frequency, and the width of the transmit impulse response at −10 dB is approximately 1.2 cycles.

Thus, it can be seen that a transformer 14 in a transducer 10 in accordance with the invention can be designed to provide a desired frequency response and/or transmit pulse relative to the bandwidth and center frequency by control of the thicknesses of the integrated circuit, the interconnect layer and the acoustically active layer(s). The transformer can be designed to provide a frequency response having a bandwidth at −3 dB of at least 70%, 80% or 90% of the center frequency and/or a transmit impulse response having a width at −10 dB of less than about 1.6 cycles, less than about 1.4 cycles or less than about 1.2 cycles of the center frequency.

The design and formation of the transformer 14 to include the integrated circuit 30, the acoustic layers 32, 34, 36 and/or 38 (and possibly others) and the interconnect layer 40 optimizes the acoustic impedance seen at the top side of the transformer 14 (which is the same as seen at the back side of the piezoelectric layer 16).

In contrast to the invention, in the prior art transducer element, the transformation is not optimized for high performance because there are only two layers (i.e., the semiconductor chip 110 and the interconnect layer 112) and their properties are constrained by other aspects of the design. For example, nearly all integrated circuits are fabricated as silicon chips. The inventor has realized that the addition of other acoustic layers allows these constraints to be embedded in the design of a larger impedance transformer and thus to provide the ability to disregard the constraints on the semiconductor chip per se. Although illustrative embodiments of the present invention have been described herein with reference to the accompanying drawings, it is to be understood that the invention is not limited to these precise embodiments, and that various other changes and modifications may be effected therein by one of ordinary skill in the art without departing from the scope or spirit of the invention.

The invention claimed is:

1. An ultrasonic transducer, comprising:

an acoustic backing block;

an acoustic impedance transformer arranged on said backing block;

a piezoelectric layer arranged on said transformer; and at least one matching layer arranged on said piezoelectric layer;

said transformer including a substrate, an electronic circuit arranged in connection with said substrate, an interconnect layer having an acoustic impedance interposed between said substrate and said piezoelectric layer and at least a first acoustically active layer different than said backing block.

2. The transducer of claim 1, wherein said interconnect layer is arranged between said substrate and said first acoustically active layer, said substrate being arranged adjacent said backing block and said first acoustically active layer being arranged adjacent said piezoelectric layer.

3. The transducer of claim 1, wherein said transformer further includes a second acoustically active layer arranged on an opposite side of said substrate from said first acoustically active layer.

4. The transducer of claim 1, wherein said transformer further includes second and third acoustically active layers arranged between said substrate and said backing block.

5. The transducer of claim 1, wherein said first acoustically active layer is arranged adjacent said piezoelectric layer, said interconnect layer being arranged between said substrate and said first acoustically active layer and second and third acoustically active layers arranged between said substrate and said backing block.

6. The transducer of claim 5, further comprising at least one additional acoustically active layer, said first and said at least one additional acoustically active layers being arranged between said interconnect layer and said piezoelectric layer.

7. The transducer of claim 1, wherein said first acoustically active layer is arranged adjacent said piezoelectric layer, said transducer comprising a plurality of independent elements arranged in an array in one or two dimensions, each of said elements including a section of said piezoelectric layer and a section of said first acoustically active layer.

8. The transducer of claim 1, wherein said transducer comprises a plurality of independent elements arranged in a curve.

9. The transducer of claim 1, wherein said transformer is designed to provide the transducer with a frequency response having a bandwidth at the −3 dB points of at least 70%, at least 80% or at least 90% of the center frequency.

10. The transducer of claim 1, wherein said transformer is designed to provide the transducer with a transmit impulse response having a width at the −10 dB points of less than 1.6 cycles, less than 1.4 cycles or less than 1.2 cycles of the center frequency.

* * * * *